United States Patent [19]

Mattuschka

[11] 4,379,247
[45] Apr. 5, 1983

[54] RESONATOR PLATE CAPABLE OF EXCITATION TO THICKNESS SHEAR VIBRATIONS

[75] Inventor: Werner Mattuschka, Munich, Fed. Rep. of Germany

[73] Assignee: Siemens Aktiengesellschaft, Berlin & Munich, Fed. Rep. of Germany

[21] Appl. No.: 211,762

[22] Filed: Dec. 1, 1980

[30] Foreign Application Priority Data

Feb. 6, 1980 [DE] Fed. Rep. of Germany ....... 3004331

[51] Int. Cl.³ .......................................... H01L 41/08
[52] U.S. Cl. ................................... 310/367; 310/353; 310/368
[58] Field of Search ............... 310/312, 361, 367, 368, 310/369, 351–353

[56] References Cited

U.S. PATENT DOCUMENTS

| | | |
|---|---|---|
| 1,969,339 | 8/1934 | Usselman ...................... 310/353 X |
| 2,018,246 | 10/1935 | Beard ................................... 310/368 |
| 2,245,178 | 6/1941 | Bechmann ..................... 310/369 X |
| 4,017,753 | 4/1977 | Ishiwata .............................. 310/9.6 |
| 4,124,809 | 11/1978 | Engdahl et al. ............... 310/368 X |
| 4,167,686 | 9/1979 | Fukuyo ........................... 310/367 X |
| 4,234,812 | 11/1980 | Kawashima ........................ 310/368 |
| 4,247,797 | 1/1981 | Echigo et al. .................. 310/368 X |
| 4,287,447 | 9/1981 | Skoda et al. ........................ 310/353 |

FOREIGN PATENT DOCUMENTS 2806435  5/1979  Fed. Rep. of Germany .

*Primary Examiner*—Mark O. Budd
*Attorney, Agent, or Firm*—Hill, Van Santen, Steadman, Chiara & Simpson

[57] ABSTRACT

A piezoelectric resonator plate capable of excitation to thickness shear vibrations is provided on each of its large surfaces with a respective excitation electrode and is provided, at least in partial regions of its border, a thickness decreasing in the direction of the border of the plate in the form of a beveling, whereby in the region of such a border beveling, respectively, a connection member contacts one of the excitation electrodes.

10 Claims, 6 Drawing Figures

RESONATOR PLATE CAPABLE OF EXCITATION TO THICKNESS SHEAR VIBRATIONS

BACKGROUND OF THE INVENTION

1. Field of the Invention

The present invention relates to a piezoelectric resonator plate capable of excitation to thickness shear vibrations, which is provided with an excitation electrode on each of its large surfaces, and which, at least in partial regions of its border, exhibits a decreasing thickness in the direction of the border of the plate, whereby, in the region of such a border beveling, a contacting member contacts ones of the excitation electrodes.

2. Description of the Prior Art

A resonator plate of the type generally set forth above is known, for example, from the German published application No. 28 06 435. With the aid of such a border-side beveled plate, it is possible to reduce the dimensions of the resonator in the plane of its large surfaces without having the functional efficiency of the resonator being impaired due to interferences which can be brought about, in particular, by the connecting member covering the resonator in border zones and contacting the excitation electrodes. Since, however, in the region of the bevelings, for the manufacture of the latter, resonator material must be removed, excitation electrodes, or the connection electrodes, respectively, extending from the excitation electrodes to the engagement points of the connection members, can be applied on the resonator only after the bevelings have been created, since the electrodes otherwise would again be removed in the region of the bevelings together with the resonator material.

However, in the case of certain manufacturing operating sequences for such resonators, it is desirable to be able to apply the electrodes on the resonator prior to creation of the bevelings.

SUMMARY OF THE INVENTION

Accordingly, it is the object of the invention to provide a resonator plate of the type generally set forth above such that the border-side bevelings are capable of being created in the resonator plate also subsequently to the application of the electrodes on the resonator plate.

In accordance with the invention, the above object is achieved in that the border bevelings, at least in the region in which a connection is provided between the connection member and an excitation electrode, are respectively incorporated only in the side of the resonator plate which is opposite the respective excitation electrode which is to be contacted.

In this manner, border bevelings are produced, at least in the border sections in which the two connection members—provided for the connection of one excitation electrode each—cover the resonator plate, which border bevelings, in the case of the one connection member, are present only on the one side of the resonator plate, and in the case of the other connection member, are provided only on the other side of the resonator plate, so that always one resonator side, at least in the region of a connection member, remains unimpaired by the bevelings. Therefore, the electrode surfaces, provided on the respectively unimpaired resonator sides, can also extend unaltered to the border of the plate. Electrode surfaces are here even advantageous which originally extend to the border of the resonator plate, were removed again from the resonator at the border side on that particular side of the resonator on which the connection member in the corresponding border section is to establish no contact with the excitation electrode provided on this side of the resonator plate, the connection member covering the resonator plate and surrounding the same at the border side, such that for example no masks are required during application of the electrodes.

In a further embodiment of the invention, it is provided that the large surfaces of the resonator plate are displaced relative to one another in a parallelogram fashion by the bevelings, and that, in the case of a resonator plate consisting of quartz having a rectangular profile, whose large surfaces extend parallel to the crystallographic x,z' plane, the parallelogram-like displacement in the z' direction is provided, or that, in the case of a rectangular plate configuration, the border bevelings are associated with connection member border sections, respectively, which are adjacently provided on the same border side of the resonator plate. In the case of a resonator plate consisting of quartz having a rectangular profile, whose large surfaces extend parallel to the crystallographic x,z' plane, the border bevelings—associated with the connection member border sections—are provided on one border side of the resonator plate, which border side extends parallel to the x direction. The border bevelings exhibit a concave, convex or stepped shape. The bevelings extend only over one portion of the thickness of the resonator plate, and the excitation electrodes cover the entire, non-beveled region of the large surfaces, respectively.

BRIEF DESCRIPTION OF THE DRAWINGS

Other objects, features and advantages of the invention, its organization, construction and operation will be best understood from the following detailed description, taken in conjunction with the accompanying drawings which are not true-to-scale, and on which.

DESCRIPTION OF THE PREFERRED EMBODIMENTS

Figure 1:
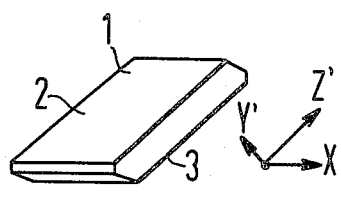
FIG. 1 illustrates in an oblique perspective, a resonator plate designed in the form of a parallelopiped.

In detail, it can be seen from the drawing that a resonator plate 1, preferably consisting of quartz, having a rectangular profile, exhibits two mutually parallel large surfaces 2, 3 extending in the crystallographic x, z' plane, which, through their distance from one another, determine the thickness of the resonator in the y' direction. Such resonator plates are preferably employed as thickness shear crystals for frequencies in the MHz range, whereby excitation electrodes 4, 5 consisting of a thin contiguous metal layer, which cover at least central regions of the large surfaces 2, 3 of the resonator plate, are disposed opposite one another and are respectively provided for the purpose of connection to the poles of an a.c. voltage source.

The dimensions of such a resonator plate 1 transversely to its frequency-determining thickness cannot be made randomly small if the vibrating properties of the resonator are not to be impaired. However, the dimensions of such a resonator plate transversely to its thickness can be made smaller than would be necessary in the case of a coplanar plate, if one reduces the thickness of the resonator in the direction of the border. Such border bevelings 6, 7 are necessary, in particular in those border sections of the resonator in which connection members 8—which are most often simultaneously employed for mechanical support and mounting of the resonator plate 1—are connected with the resonator plate 1. Such connection members are most frequently designed in the form of U-shaped clips which embrace the resonator plate at the border side and thus contact, on one side of the resonator, an excitation electrode 4, 5 or a connection electrode, respectively, connected with the corresponding excitation electrode 4 or 5. The term connection electrode is here to be understood as an electrode opposite which there is no electrode surface on the other side of the resonator plate so that in the region of the connection electrodes no resonator vibrations can be excited.

In order to be able to apply the electrodes 4, 5 on the resonator plate 1 prior to the incorporation of the bevelings 6, 7 on the sides 2, 3 of the resonator, the bevelings 6, 7—which are respectively associated with a border section of the resonator plate 1, in which a connection member 8 embraces the resonator plate at the border side—are so designed that always only that particular side of the resonator plate 1 is respectively engaged by the bevelings 6, 7, which side is disposed opposite the excitation electrode 4, 5, respectively, which is to be contacted by the respective connection member 8. The electrode to be contacted thereby remains preserved unaltered, respectively, up to the border of the resonator plate 1. In addition, as a consequence of this design of the bevelings 6, 7, the large surfaces 2, 3 of the resonator plate 1, prior to the production of the bevelings 6, 7, can be completely provided—i.e. up to the border of the resonator plate 1—with an electrode coating, since, through the provision of the bevelings 6, 7, the oppositely disposed electrode layer is again automatically removed in the border sections of the resonator plate in which the connection members 8 contact one of the two electrode surfaces. The electrode layers on the sides of the resonator plate, therefore, automatically form connection electrodes in the region of these border sections.

Figure 2:
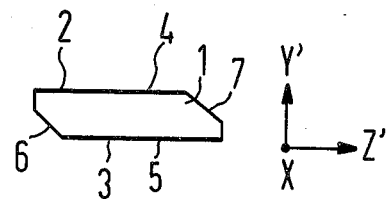
FIG. 2 illustrates the resonator plate of FIG. 1 as viewed in side elevation.
Figure 6:
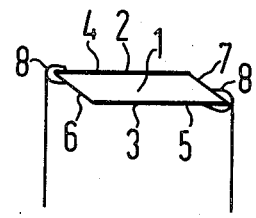
FIG. 6 illustrates a resonator plate according to FIGS. 1 and 2 which, at border sides opposite one another, is covered by respective connection members.

For example, the resonator plate corresponding to FIGS. 1 and 2, as can be seen in FIG. 6, is embraced by the connection members 8 at two border sides disposed opposite one another in the z' direction, whereby the connection members 8, as a consequence of the specific design of the bevelings 6, 7 contact only one electrode surface, respectively.

Figure 3:
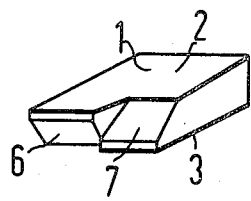
FIG. 3 illustrates a resonator plate in an oblique perspective, with bevelings provided only on one border side, whereby the bevelings extend oppositely relative to one another in border sections associated with the two connection members.
Figure 4:
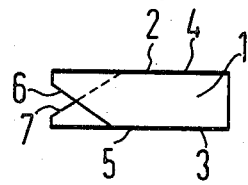
FIG. 4 illustrates the resonator plate of FIG. 3 in side elevation.

If both connection members 8 engage the resonator plate on the same border side of the resonator plate, then two adjacently disposed border sections with a mutually opposite shape of the border bevelings 6, 7 are to be formed, as is seen in FIGS. 3 and 4.

Figure 5:
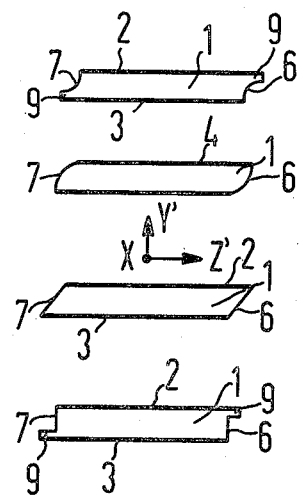
FIG. 5 illustrates several differently-designed bevelings, each shown in side elevation.

FIG. 5 illustrates that the bevelings 6, 7 extend in a convex form, a concave form, an oblique planar form or a stepped form which includes one or more steps across the thickness of the resonator. In all instances, the beveling need not engage the entire thickness of the resonator plate 1, so that a stepped-shaped recess region 9 may remain.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A piezoelectric resonator for excitation into thickness shear vibrations, comprising:
    a body of piezoelectric material including
    a pair of major spaced-apart surfaces;
    a pair of electrodes carried on and completely covering respective ones of said major surfaces;
    a pair of border regions adjacent said major surfaces and free of electrode coating, each of said border regions extending from one of said major surfaces toward the other major surface and shaped such that there is a longitudinal offset of at least portions of said major surfaces; and
    a pair of connection members each comprising U-shaped clips and each engaging a respective electrode on a major surface and a respective border region.

2. The piezoelectric resonator of claim 1, wherein:
    said major surfaces and said border regions define, in a transverse view, a parallelogram.

3. The piezoelectric resonator of claim 1, wherein:
    said body comprises quartz and has a generally rectangular transverse profile;
    said major surfaces extend parallel to the x, z' crystallographic plane; and
    the offset is in the z' direction.

4. The piezoelectric resonator of claim 1, wherein:
    said body comprises quartz;
    said major surfaces extend parallel to the x, z' crystallographic plane; and
    said border regions extend generally parallel to the x direction.

5. The piezoelectric resonator of claim 1, wherein:
    said border regions have a convex shape.

6. The piezoelectric resonator of claim 1, wherein:
    said border regions have a concave shape.

7. The piezoelectric resonator of claim 1, wherein:
    said border regions have a oblique planar shape.

8. The piezoelectric resonator of claim 1, wherein:
    said border regions include bevelings extending over a portion of the thickness of said body.

9. A piezoelectric resonator for excitation into thickness shear vibrations, comprising:
    a body of piezoelectric material including
    a pair of major spaced-apart surfaces;
    a pair of electrodes carried on and completely covering respective ones of said major surfaces;
    a pair of border regions adjacent said major surfaces and on the same edge of said body, each of said border regions extending from one of said major surfaces toward the other major surface and shaped such that there is a longitudinal offset of at least portions of said major surfaces and the electrodes carried thereon; and a pair of connection members each engaging a respective electrode and a respective border region.

10. A piezoelectric resonator for excitation into thickness shear vibrations, comprising:
   a body of piezoelectric material including
   a pair of major spaced-apart surfaces;
   a pair of electrodes carried on respective ones of said major surfaces;
   a pair of border regions adjacent said major surfaces, each of said border regions extending from one of said major surfaces toward the other major surface and having a stepped-shaped such that there is a longitudinal offset of at least portions of said major surfaces and the electrodes carried thereon; and
   a pair of connection members each engaging respective electrode and a respective border region.

* * * * *